United States Patent
Thiery

(10) Patent No.: US 7,463,087 B2
(45) Date of Patent: Dec. 9, 2008

(54) OPERATIONAL AMPLIFIER WITH ZERO OFFSET

(75) Inventor: Vincent Thiery, La Roque d'Antheron (FR)

(73) Assignee: International Rectifier Corporation, El Segundo, CA (US)

( * ) Notice: Subject to any disclaimer, the term of this patent is extended or adjusted under 35 U.S.C. 154(b) by 90 days.

(21) Appl. No.: 11/553,689

(22) Filed: Oct. 27, 2006

(65) Prior Publication Data
US 2007/0109043 A1    May 17, 2007

Related U.S. Application Data

(60) Provisional application No. 60/730,597, filed on Oct. 27, 2005.

(51) Int. Cl.
*H03F 1/02* (2006.01)
(52) U.S. Cl. .......................................... 330/9; 327/124
(58) Field of Classification Search .................. 330/9, 330/124, 307; 327/124, 307
See application file for complete search history.

(56) References Cited

U.S. PATENT DOCUMENTS

| 4,423,385 | A | 12/1983 | Evans et al. | |
|---|---|---|---|---|
| 4,931,745 | A * | 6/1990 | Goff et al. | 330/9 |
| 5,959,498 | A | 9/1999 | Sauer | |
| 6,002,299 | A | 12/1999 | Thomsen | |
| 6,734,723 | B2 * | 5/2004 | Huijsing et al. | 330/9 |
| 7,292,095 | B2 * | 11/2007 | Burt et al. | 330/9 |

* cited by examiner

*Primary Examiner*—Henry K Choe
(74) *Attorney, Agent, or Firm*—Ostrolenk, Faber, Gerb & Soffen, LLP

(57) ABSTRACT

A circuit for minimizing a voltage offset between inverting and non-inverting input terminals of an operational amplifier circuit is provided. The circuit includes a chopper circuit connected to the inverting and non-inverting input terminals of the operational amplifier circuit, the chopper circuit including: an amplifier having differential outputs; and a switching circuit for periodically reversing the input terminals to the amplifier and periodically reversing the outputs of the amplifier to provide an output signal having an offset adjustment signal to the operational amplifier circuit to adjust the offset of the operational amplifier circuit.

7 Claims, 7 Drawing Sheets

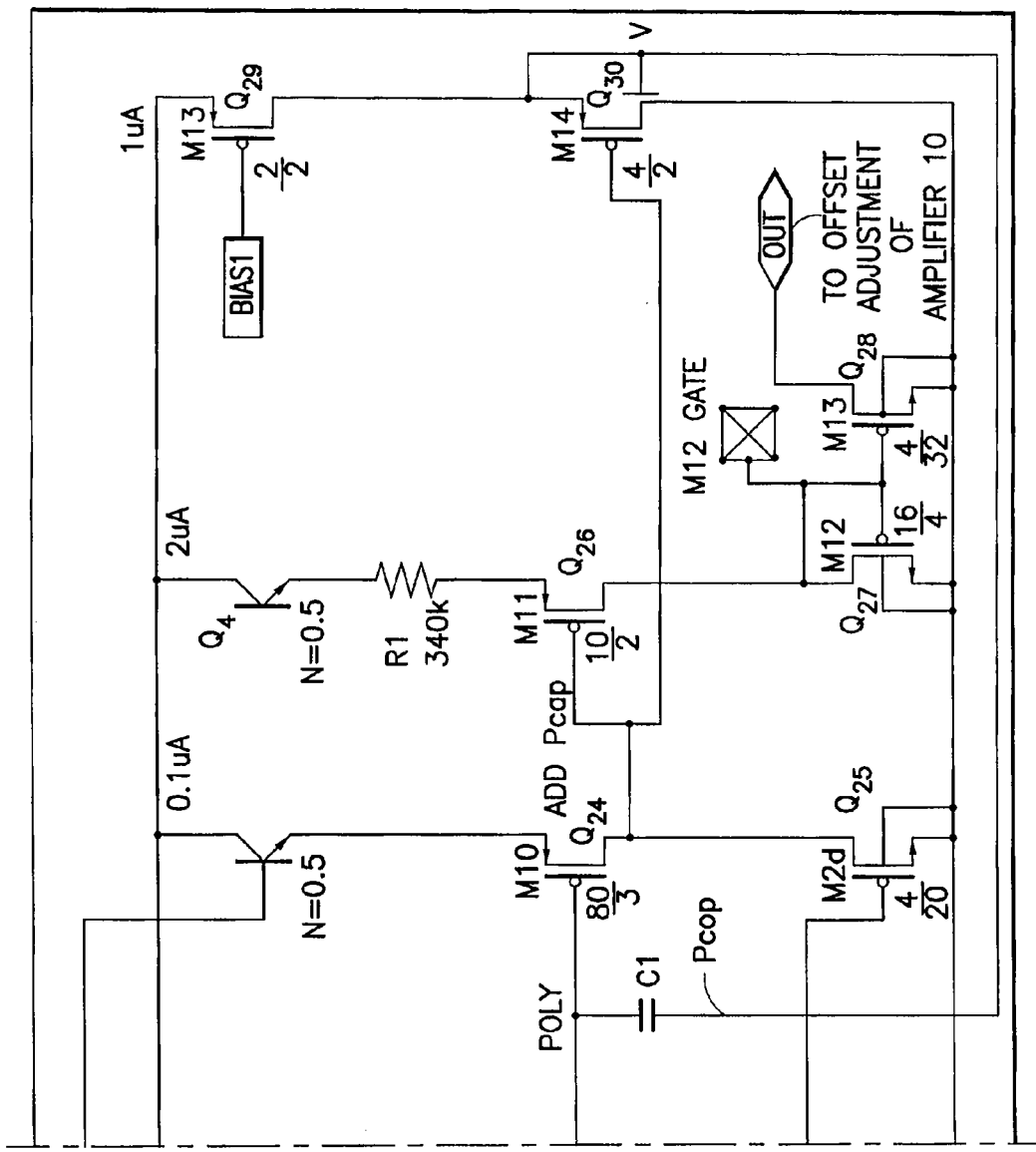

| FIG.4A | FIG.4B |
|---|---|

OPERATIONAL AMPLIFIER WITH ZERO OFFSET

CROSS-REFERENCE TO RELATED APPLICATION

This application is based on and claims the benefit of U.S. Provisional Application Ser. No. 60/730,597, filed on Oct. 27, 2005, entitled OPERATIONAL AMPLIFIER WITH ZERO OFFSET, to which a claim of priority is hereby made and the disclosure of which is incorporated by reference herein.

BACKGROUND OF THE INVENTION

The present invention is directed to operational amplifiers and more particularly to providing an operational amplifier with a zero voltage offset between its input terminals.

The amount of the voltage offset between the input terminals of an operational amplifier is important because a voltage offset in the 1 millivolt range can create a standard deviation of 0.4 amperes current offset in a current sensing power MOSFET (5 m Ohm $RDS_{ON}$) in the output stage.

SUMMARY OF THE INVENTION

It is an object of the present invention to provide a circuit in which the voltage offset between input terminals of an operational amplifier is reduced, for example, by a factor of 10, thereby to improve the accuracy of the output current sensing in a power stage.

A circuit for minimizing a voltage offset between inverting and non-inverting input terminals of an operational amplifier circuit is provided. The circuit includes a chopper circuit connected to the input terminals of the operational amplifier circuit, the chopper circuit including an amplifier and a switching circuit for periodically reversing the input terminals to the amplifier and periodically reversing outputs of the amplifier to provide an output signal as an offset adjustment signal to the operational amplifier circuit for adjusting the offset of the operational amplifier circuit.

Other features and advantages of the present invention will become apparent from the following description of the invention that refers to the accompanying drawings.

DETAILED DESCRIPTION OF EMBODIMENTS OF THE INVENTION

Figure 1:
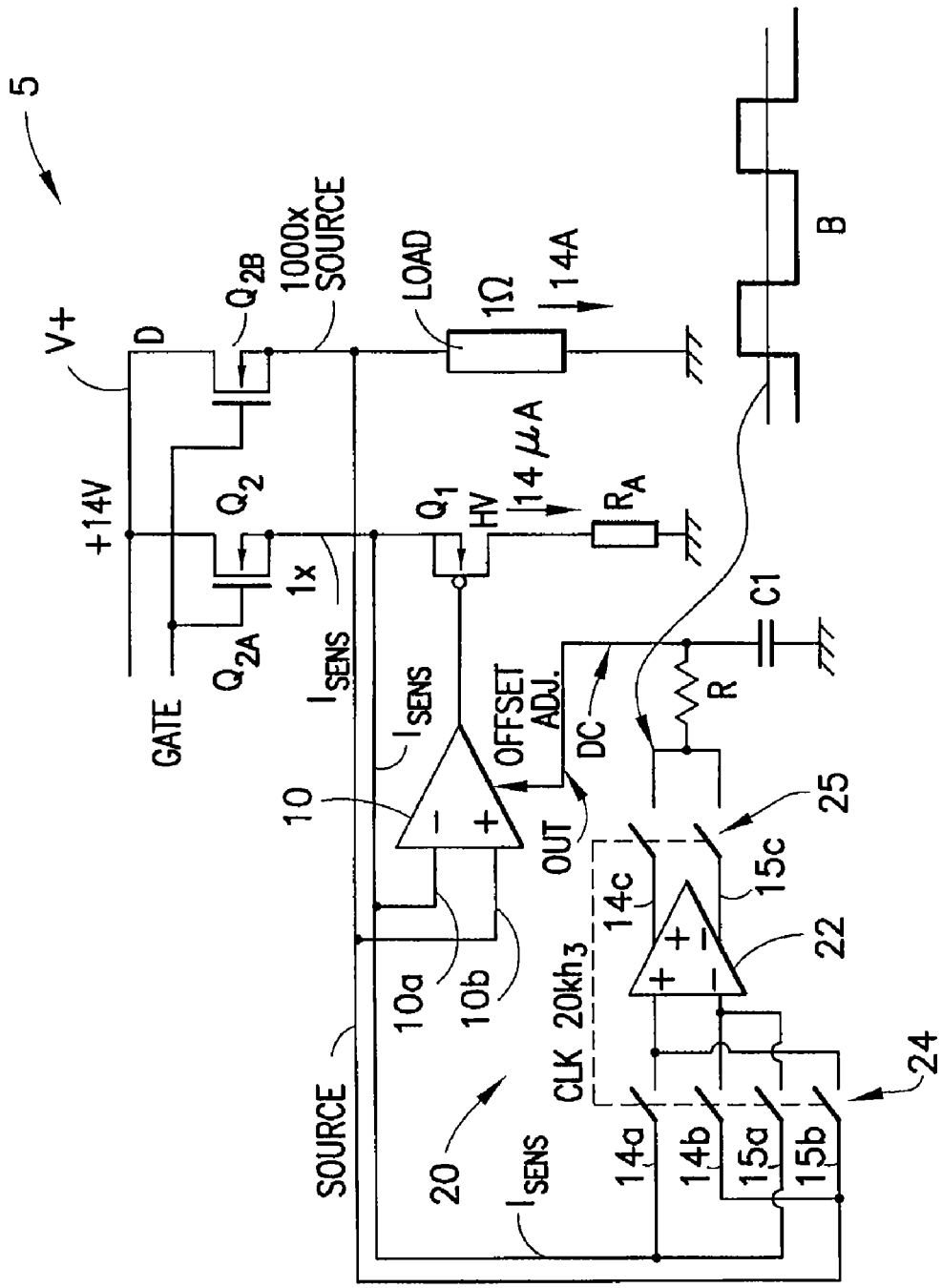
FIG. 1 is a simplified circuit diagram comprising an operational amplifier and the offset adjustment circuit according to the invention.

With reference now to the drawings, FIG. 1 shows a power MOSFET $Q_2$ comprising a sense cell $Q_{2A}$ and a main current carrying cell $Q_{2B}$. The transistor $Q_2$ drives the load indicated from a potential source V+. The transistor $Q_2$ is driven by a driver circuit, (not shown) at the terminal GATE.

An operational amplifier 10 is provided to drive a transistor $Q_1$ to adjust the current in the sense cell $Q_{2A}$. It is important that the offset voltage across the amplifier 10 input terminals 10a and 10b be as low as possible in order to adjust the current through the transistor $Q_1$ so that the current in the transistor $Q_2$ can be accurately sensed.

In order to do this, a chopper circuit 20 is employed.

As shown in FIG. 1, the operational amplifier 10 has an offset voltage between its inverting and non-inverting input terminals 10a and 10b. The output of the amplifier 10 is connected to a gate of the transistor Q1 for driving that transistor Q1 to adjust the current in a resistor $R_A$ and thus in the sense cell $Q_{2A}$.

As stated above, it is important to minimize the offset voltage between the input terminals 10a and 10b of the operational amplifier 10, connected respectively to isens and source of the transistor $Q_2$. To this end, i.e., to minimize the offset voltage between the input terminals 10a and 10b of the amplifier 10, the input terminals are coupled to a chopper circuit 20. The chopper circuit 20 comprises a differential amplifier 22, a first input switching circuit 24, a second output switching circuit 25, and an RC noise filter circuit including a resistor R and a capacitor C1.

The first switch 24 is implemented electronically to reverse the isens and source signal inputs to the differential amplifier 22. The second electronic switch 25 reverses the differential outputs. The reversing is performed periodically when initiated by a clock signal. Thus, when the clock signal activates switches 14a and 14b, the isens signal is provided to the non-inverting input and the source signal is connected to the inverting input of the differential amplifier 22. At the output, switch 14c connects the positive output of the differential amplifier 22 to the RC filter.

A second related clock signal is used to activate switches 15a and 15b. These switches reverse the isens and source signal inputs to the differential amplifier 22. At the same time, switch 15c connects the negative output of the amplifier 22 to the RC filter. This input/output switching results in an output of the chopper circuit 20 comprising a positive and negative going square wave B at the input to the RC filter. This signal is filtered by the RC filter into a DC level signal to adjust the offset of the amplifier 10. The output of amplifier 10 then is provided to the gate of the transistor $Q_1$ to adjust the current in the sense cell $Q_{2A}$.

The differential amplifier 22 itself has an offset voltage at its input due to the internal circuitry of the amplifier 22. The offset of the amplifier 22 will be amplified positive or negative in the output signal from the amplifier 22 after the output switch 25. After filtering, the average of the offset of the amplifier 22 will be zero if the duty cycle of the amplifier, set by the clock, is 50%. Other techniques can be used to remove the offset of the amplifier 22, such as switched capacitors or auto calibration.

Since the main amplifier 10 offset signal (across its input terminals) is before the input switch 24 of the chopper circuit 20, this offset signal will be inverted twice (by the switches 24 and 25), so its polarity will always be the same. After filtering by the RC circuit, the chopped waveform B will have an average DC level that will compensate the main amplifier 10 for its offset voltage.

The average output value of the chopper circuit 20 is thus independent of the chopper differential amplifier 22 offset voltage. Therefore, when the offset voltage of the amplifier 10 increases, the chopped output of the differential amplifier 22 increases to drive the offset of the amplifier 10 to a lower value. The circuit 5 operates in a closed loop so that the resulting voltage across the input terminals 10a and 10b of the amplifier 10 is zero.

Figure 2A:
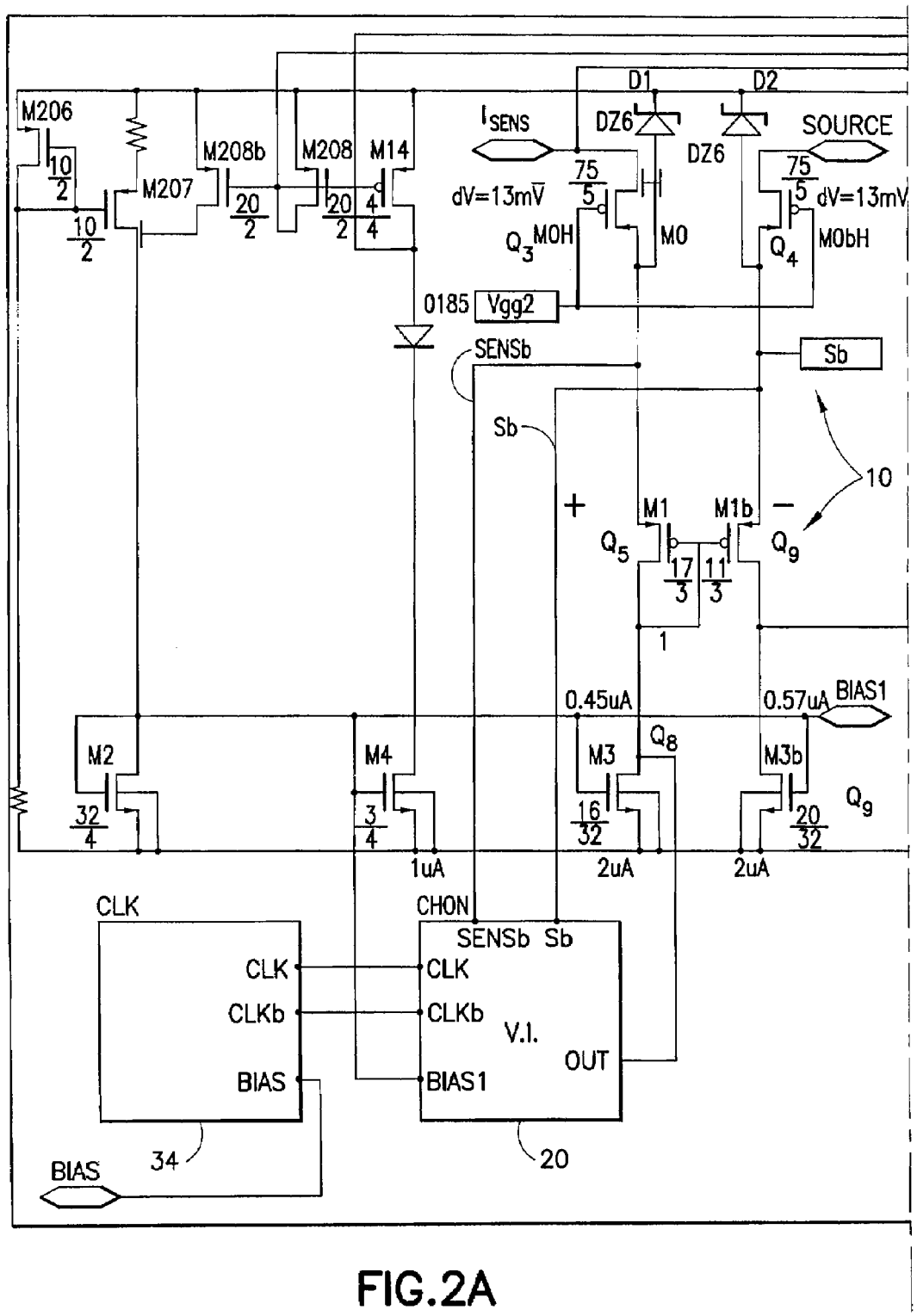
FIG. 2 is a diagram showing an implementation of the circuit of FIG. 1.
Figure 2B:
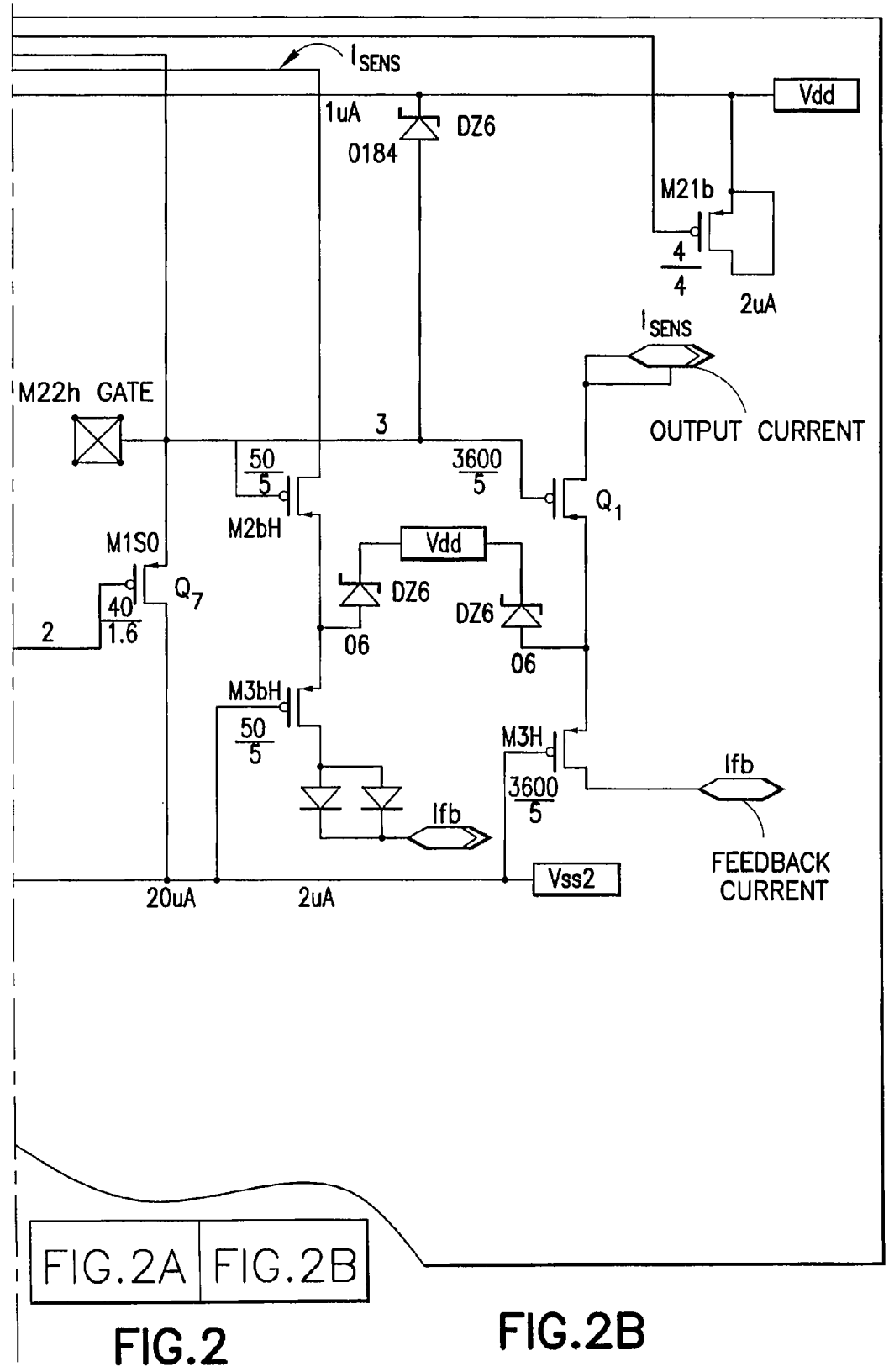

FIG. 2 illustrates a schematic implementation of the circuit 5 of FIG. 1. The power transistor $Q_2$ is not shown in FIG. 2.

The circuit of FIG. 2 is a normal closed loop amplifier system. The inputs to the amplifier 10 are indicated at isens and source, as in FIG. 1. With the circuit shown, the offset voltage across the inputs of the amplifier 10 is close to zero (output/gain). As discussed above, without the chopper circuit, an offset voltage of about 1 mV of the amplifier 10 would generate a standard deviation of 0.4 A current offset in a current sensing power MOSFET having a 5 m Ohm $RDS_{ON}$.

Figure 3A:
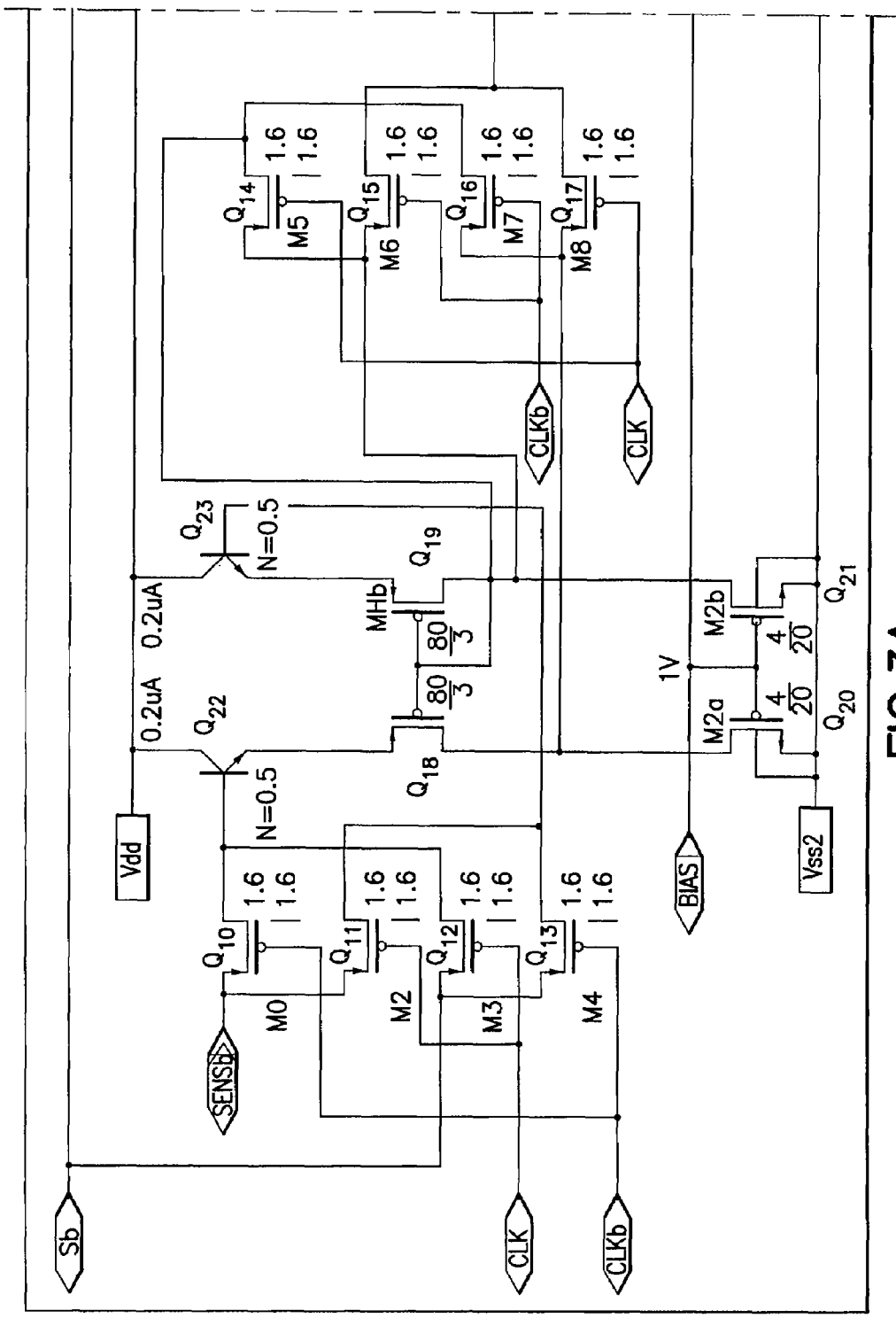
FIG. 3 is a diagram showing an implementation of the chopper circuit of FIG. 1.

The circuit shown in FIG. 1 is simplified. The circuit of FIG. 2 shows additional components in an actual implementation. For example, the signals isens and source from the main power transistor $Q_2$ are provided through pass transistors $Q_3$ and $Q_4$ respectively, becoming signals sensb and sb provided to the inputs of the chopper circuit 20. The chopper circuit 20 is shown as a block in FIG. 2, and its implementation is shown in FIG. 3.

The circuit of FIG. 2 includes a 50% duty cycle clock circuit 34 (e.g., at 10 kHz or 20 kHz). The chopper circuit 20 inputs sensb and sb are connected to sources of transistors $Q_5$ and $Q_6$ of the amplifier 10. The output (OUT) from the chopper circuit 20 effectively corrects the amplifier 10 offset to below 0.1 mV giving less than a 0.04 A offset error in the output stage. This offset measurement is a ten-times improvement in the output current offset. The amplifier 10 output (500 kHz bandwidth) is provided to the gate of the transistor $Q_1$ via a transistor $Q_7$. Terminal Ifb is provided with a feedback current proportional to the main power MOSFET $Q_2$ current.

In the present embodiment, standard techniques, e.g., capacitor switching, cannot be used directly on the amplifier 10 because output signal needs to be available at all times. The circuit 30 only operates when the voltage at the input of the amplifier 10 is offset, with the amplifier used in a closed loop system.

In the circuit of FIG. 2, the size of a current mirror comprising transistors $Q_8$ and $Q_9$, which receives the output (OUT) from the chopper circuit 20, is intentionally not matched to create a systematic amplifier offset of 3 mV. The systematic offset is designed to be larger than the maximum offset of the amplifier shown. The chopper circuit 20 adds a current in the transistor $Q_8$ to compensate for its size, which is small in comparison with the size of the transistor $Q_9$.

The current mirror circuit, comprising the transistors $Q_8$ and $Q_9$, adjusts the amplifier offset. The amplifier output from transistors $Q_5$ and $Q_6$ is provided by the transistor $Q_7$ to the gate of the transistor $Q_1$.

FIG. 3 illustrates the chopper circuit 20 of FIG. 1. The chopper circuit 20 comprises a number of switches that function as the first and second switches 24, 25 of FIG. 1: input amplifier switch transistors $Q_{10}$, $Q_{11}$, $Q_{12}$, and $Q_{13}$, and output amplifier switch transistors $Q_{14}$, $Q_{15}$, $Q_{16}$, and $Q_{17}$. The input switches connect directly or reverse the inputs to the first stage of the chopper amplifier differential input pair transistors $Q_{18}$, $Q_{19}$ coupled to a current mirror comprising transistors $Q_{20}$ and $Q_{21}$. The differential amplifier comprising the four transistors $Q_{18}$, $Q_{19}$, $Q_{20}$, and $Q_{21}$ has a gain of about 200. These transistors provide very low bias current without the use of a resistor, i.e., in the range of 0.1 uA, and provide the RC filter together with the capacitor C1. The output switches periodically reverse the differential amplifier outputs.

In particular, in the input switch side, the P-channel transistor $Q_{10}$ has a gate terminal connected to receive a clock (clkb) signal, a source terminal connected to receive the sensb input signal, and a drain terminal connected to the base of a transistor $Q_{22}$. The P-channel transistor $Q_{11}$ has a gate terminal connected to receive a clock (clk) signal, a source terminal connected to receive the sensb input signal, and a drain terminal connected to the base of a transistor $Q_{23}$. The P-channel transistor $Q_{12}$ has a gate terminal connected to receive the clk signal, a source terminal connected to receive the sb input signal, and a drain terminal connected to the base of the transistor $Q_{22}$; and the P-channel transistor $Q_{13}$ has a gate terminal connected to receive the clkb signal, a source terminal connected to receive the sb signal, and a drain terminal connected to the base of the transistor $Q_{23}$.

On the output switch side, the chopper circuit 20 further comprises the P-channel transistor $Q_{14}$ having a gate terminal connected to receive the clk signal, a source terminal connected to drains of the transistors $Q_{19}$ and $Q_{21}$, and a drain terminal connected to gate terminals of the transistors $Q_{18}$ and $Q_{19}$; the P-channel transistor $Q_{15}$ having a gate terminal connected to receive the clkb signal, a source terminal connected to the drains of the transistors $Q_{19}$ and $Q_{21}$, and a drain terminal connected to the capacitor C1; the P-channel transistor $Q_{16}$ having a gate terminal connected to receive the clkb signal, a source terminal connected to the drains of the transistors $Q_{18}$ and $Q_{20}$, and a drain terminal connected to the gate terminals of the transistors $Q_{18}$ and $Q_{19}$; the P-channel transistor $Q_{17}$ having a gate terminal connected to receive the clkb signal, a source terminal connected to the drains of the transistors $Q_{18}$ and $Q_{20}$, and a drain terminal connected to the capacitor C1 of the RC circuit.

These switches are switched at a specified clock frequency of two complementary clock signals clk and clkb provided by the clock circuit 34 (FIGS. 2 and 4) and the inputs and outputs and thus periodically reversed with the signal information maintained.

The chopper circuit 20 also includes a second stage that includes the RC filter circuit, e.g., a 1 ms filter, i.e., a 2.3 pF capacitor C1 charged with very low polarization current of the first stage amplifier in a range of 0.1 uA. A long time constant filter is thus needed. Such filter time constant should be much greater than the period of the 10 kHz or 20 kHz clock oscillator which in turn is much greater than the amplifier chopper bandwidth. A transistor $Q_{24}$ coupled to a transistor $Q_{25}$, amplifies the difference between the sensb and sb inputs and generates a current proportional to this difference and provides it to a third stage.

In the third stage, the signal from a drain terminal of the transistor $Q_{24}$ is converted via a follower transistor $Q_{26}$ and a resistor R1. The current is mirrored by mirror transistors $Q_{27}$ and $Q_{28}$ and is added to a small current leg (the transistor $Q_8$ of FIG. 2) of the amplifier 10 to adjust the amplifier 10 offset. In a closed loop, the circuit 20 adjusts current in the amplifier 10 so that the input difference (offset) in the main amplifier 10 is zero. When the chopper is used, it results in 0.1 mV standard deviation offset, as compared with a 1 mV standard offset when amplifier 10 is used alone with the same size current mirror transistor pair $Q_8$, $Q_9$.

To reduce silicon area, the Miller effect is used. The capacitor C1 is connected between the gate of the transistor $Q_{24}$ and the drain of transistor $Q_{29}$. Connecting between the gate of the transistor $Q_{24}$ and the supply would require a capacitor that is 100 times larger. This explains how a very long time constant is obtained with a very small capacitor C1. Another advantage is that the circuit 20 operates very rapidly until being close to its final state. Therefore, as long as the output of the transistor $Q_{24}$ is saturated up or down, the Miller effect does not occur and the circuit responds 100 times faster.

The pcap side of C1 is driven indirectly via a follower transistor $Q_{30}$. Low impedance is needed on this node since the pcap to epi side of the capacitor C1 may be leaky. If connected directly to the drain of the transistor $Q_{24}$, leakage larger than 0.1 uA, i.e., a bias of the transistor $Q_{24}$, makes the circuit 20 not functional when hot or in case of large load levels. No leakage problem exists on the poly side of capacitor C1.

Figures 4, 4A:
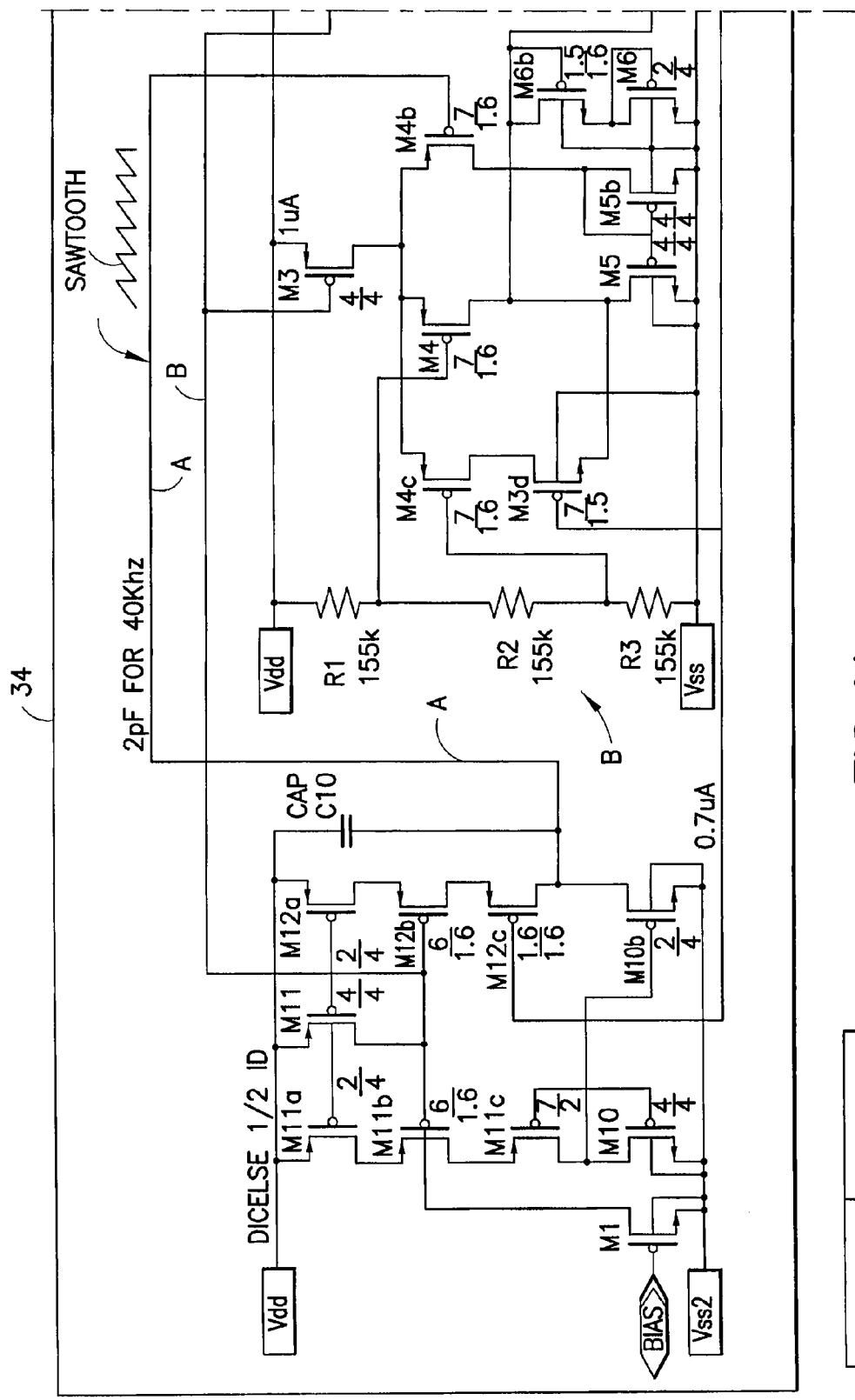
FIG. 4 is a diagram showing an implementation of the clock generator for driving the chopper circuit of FIG. 1.
Figure 4B:
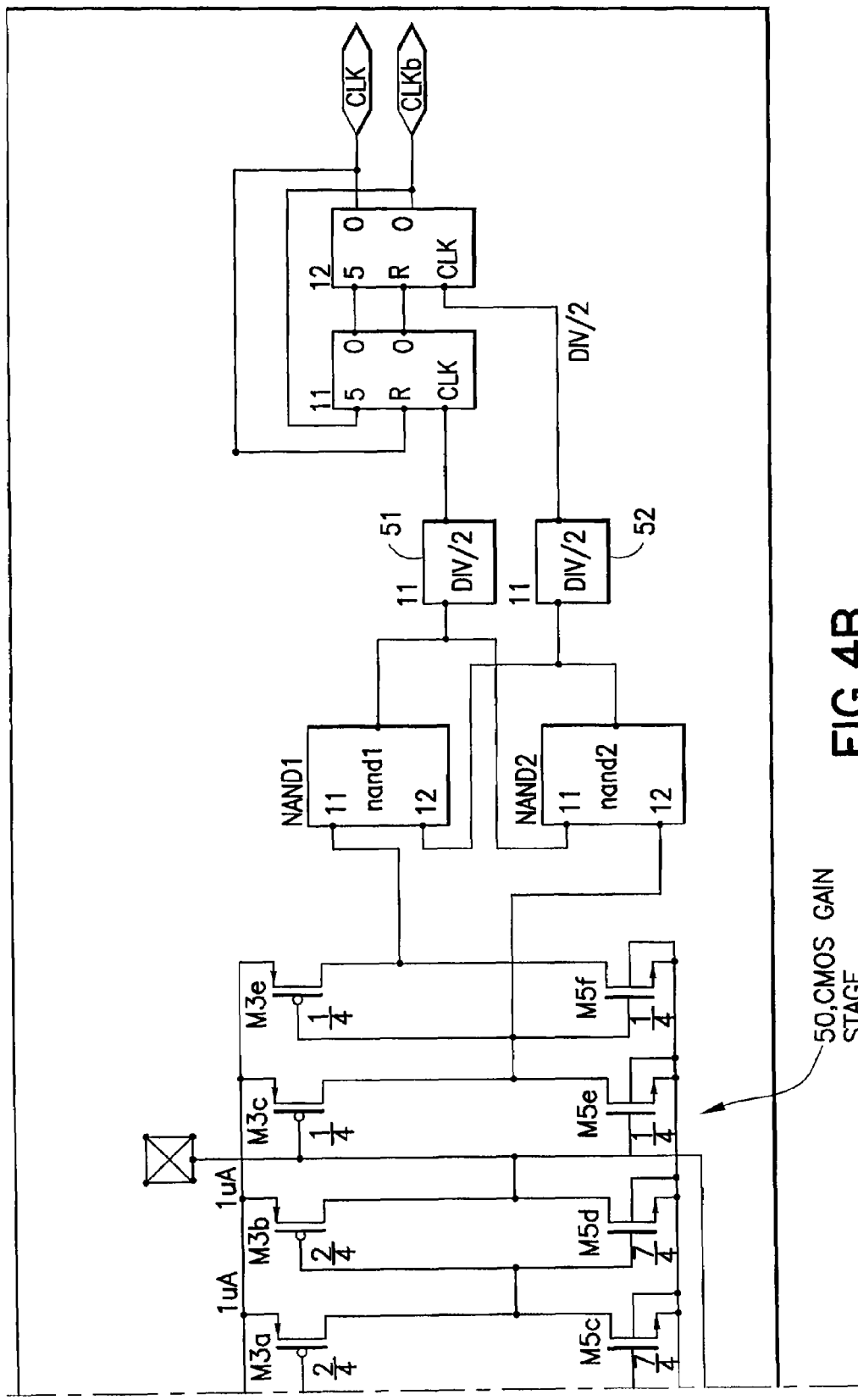

Various circuit designs may be used to implement the clock generator 34. In particular, FIG. 4 illustrates a clock generator circuit 34 that drives the chopper circuit. The circuit 34 provides a sawtooth generated by charging a capacitor CAP at 2I or discharging at I. The sawtooth clock signal is amplified by an amplifier 45 having two inputs (A and B). The output of the amplifier is provided to a number of CMOS gain stages 50. A divider is needed for division by two, because in order to remove all offsets, the duty cycle must be exactly 50%. The gain stages 50 feed gate circuits NAND1 and NAND2, followed by inverters 51 and 52 and then into the divide by 2 stage, finally resulting in clock signals clk and clkb.

The output of the clock generator comprises two complementary clock signals clk and clkb out of phase by 180°.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A circuit for minimizing a voltage offset between inverting and non-inverting input terminals of an operational amplifier circuit, the circuit comprising:

A chopper circuit connected to the inverting and non-inverting input terminals of the operational amplifier circuit, the chopper circuit comprising:

An amplifier having differential outputs;

a switching circuit for periodically reversing the input terminals to the amplifier and periodically reversing the outputs of the amplifier to provide an output signal comprising an offset adjustment signal to the operational amplifier circuit to adjust the offset of the operational amplifier circuit;

Wherein the switching circuit comprises a first switching circuit connecting the input terminals of the operational amplifier circuit to the amplifier and a second switching circuit connecting the output of the amplifier as the offset adjustment signal;

Further comprising a clock circuit for providing a clock signal to the switching circuit for periodically operating switches thereof; and A filter circuit connected at the output of the chopper circuit to provide a DC level signal as the offset adjustment signal.

2. The circuit of claim 1, wherein when the voltage offset between the inverting and non-inverting input terminals of the operational amplifier circuit increases, the offset adjustment signal increases to drive the voltage offset between the inverting and non-inverting input terminals of the operational amplifier circuit to a lower value.

3. The circuit of claim 1, wherein the amplifier comprises a differential amplifier and the second switching circuit provides alternate ones of said outputs to the operational amplifier circuit.

4. The circuit of claim 1, wherein the operational amplifier circuit comprises a current mirror receiving said offset adjustment signal to adjust the offset voltage between the inputs of the operational amplifier circuit.

5. The circuit of claim 4, wherein the current mirror comprises two unmatched transistors, thereby to create a systematic offset of the amplifier circuit, which is compensated by said offset adjustment signal.

6. A circuit for minimizing a voltage offset between inverting and non-inverting input terminals of an operational amplifier circuit, the circuit comprising:

A chopper circuit connected to the inverting and non-inverting input terminals of the operational amplifier circuit, the chopper circuit comprising:

An amplifier having differential outputs;

a switching circuit for periodically reversing the input terminals to the amplifier and periodically reversing the outputs of the amplifier to provide an output signal comprising an offset adjustment signal to the operational amplifier circuit to adjust the offset of the operational amplifier circuit;

Wherein the switching circuit comprises a first switching circuit connecting the input terminals of the operational amplifier circuit to the amplifier and a second switching circuit connecting the output of the amplifier as the offset adjustment signal;

Further comprising a clock circuit for providing a clock signal to the switching circuit for periodically operating switches thereof; and A filter circuit connected at the output of the chopper circuit to provide a DC level signal as the offset adjustment signal, Wherein the filter circuit has a long time constant compared to a clock period of the clock signal and the clock period is long compared to a period corresponding to the chopper circuit bandwidth.

7. A circuit for minimizing a voltage offset between inverting and non-inverting input terminals of an operational amplifier circuit, the circuit comprising:

A chopper circuit connected to the inverting and non-inverting input terminals of the operational amplifier circuit, the chopper circuit comprising:

An amplifier having differential outputs;

a switching circuit for periodically reversing the input terminals to the amplifier and periodically reversing the outputs of the amplifier to provide an output signal comprising an offset adjustment signal to the operational amplifier circuit to adjust the offset of the operational amplifier circuit;

Wherein the switching circuit comprises a first switching circuit connecting the input terminals of the operational amplifier circuit to the amplifier and a second switching circuit connecting the output of the amplifier as the offset adjustment signal;

Further comprising a clock circuit for providing a clock signal to the switching circuit for periodically operating switches thereof; and A filter circuit connected at the output of the chopper circuit to provide a DC level signal as the offset adjustment signal, Wherein the filter circuit has a long time constant compared to a clock period of the clock signal and the clock period is long compared to a period corresponding to the chopper circuit bandwidth, Wherein the filter circuit comprises an RC filter having a resistance and a capacitance, and the capacitance is provided by a capacitor that is connected to a supply voltage by a transistor stage, thereby reducing the size of the capacitance.

* * * * *